United States Patent
Prevost et al.

(10) Patent No.: US 9,484,956 B2
(45) Date of Patent: Nov. 1, 2016

(54) METHOD FOR CORRECTING MESSAGES CONTAINING BIT STUFFING

(75) Inventors: Raoul Prevost, Saint-Andre de Roquelongue (FR); David Bonacci, Toulouse (FR); Martial Coulon, Toulouse (FR); Jean-Yves Tourneret, Toulouse (FR); Julia Le Maitre, Grepiac (FR); Jean-Pierre Millerioux, Toulouse (FR)

(73) Assignee: CENTRE NATIONAL D'ETUDES SPATIALES ( C.N.E.S.), Paris (FR)

( * ) Notice: Subject to any disclaimer, the term of this patent is extended or adjusted under 35 U.S.C. 154(b) by 533 days.

(21) Appl. No.: 13/977,787

(22) PCT Filed: Jan. 3, 2012

(86) PCT No.: PCT/EP2012/050047
§ 371 (c)(1),
(2), (4) Date: Jul. 1, 2013

(87) PCT Pub. No.: WO2012/093116
PCT Pub. Date: Jul. 12, 2012

(65) Prior Publication Data
US 2013/0290817 A1    Oct. 31, 2013

(30) Foreign Application Priority Data
Jan. 3, 2011    (FR) ..................................... 11 50019

(51) Int. Cl.
*H03M 13/03*    (2006.01)
*H03M 13/25*    (2006.01)
(Continued)

(52) U.S. Cl.
CPC ....... *H03M 13/256* (2013.01); *H03M 13/3994* (2013.01); *H03M 13/41* (2013.01); *H03M 13/4146* (2013.01); *H03M 13/6508* (2013.01)

(58) Field of Classification Search
CPC ............. H03M 13/256; H03M 13/41; H03M 13/4107; H04L 1/006; H04L 1/0054
USPC .......................................................... 714/792
See application file for complete search history.

(56) References Cited

U.S. PATENT DOCUMENTS

| 7,876,865 B2* | 1/2011 | Peach ................ | H04B 7/18513 375/150 |
| 8,559,540 B2* | 10/2013 | Sun .................... | H03M 13/3905 375/265 |
| 2004/0008074 A1* | 1/2004 | Takehara ............. | G09G 3/3283 327/524 |

FOREIGN PATENT DOCUMENTS

| EP | 1089442 A2 | 4/2001 |
| EP | 1928179    | 11/2006 |

(Continued)

OTHER PUBLICATIONS

G. Bollati, "A 450Mbit/s Parallel Read/Write Channel with Parity Check and 16-State Time Variant Viterbi", IEEE2000 Custom Integrated Circuits Conference, May 24, 2000, pp. 319-322; XP002288505.

(Continued)

*Primary Examiner* — Albert Decady
*Assistant Examiner* — Enam Ahmed
(74) *Attorney, Agent, or Firm* — Cantor Colburn LLP

(57) ABSTRACT

The invention relates to a method for correcting a message the generation of which involves transforming an initial message and inserting bit stuffing into the transformed message, which method comprises providing an observation sequence containing the message to be corrected. A number of path hypotheses are generated via a trellis diagram associated with the transformation. The nodes of the trellis diagram each represent a state of a finite-state machine capable of transforming the initial message and the branches represent the possible transitions between nodes. Among the branches of the trellis diagram, certain represent conditional transitions that may be made only when bit stuffing is present. During the generation of a path hypothesis, bit stuffing is detected and the branches taken are those associated with the detected bit stuffing. The most likely path hypothesis relative to the observation sequence is finally retained.

13 Claims, 10 Drawing Sheets

(51) Int. Cl.
  *H03M 13/39* (2006.01)
  *H03M 13/41* (2006.01)
  *H03M 13/00* (2006.01)

(56) References Cited

FOREIGN PATENT DOCUMENTS

JP         555932 A    3/1999
JP    2007295532 A    11/2007

OTHER PUBLICATIONS

Dragan Petrovic, "List Viterbi Decoding with Continuous Error Detection for Magnetic Recording", Globecomm 2001 vol. 5, pp. 3007-3011, XP010747545.
Juan Song, "Design and Implementation of WTB Controller Using SOPC Technology", Signal Processing, 2008 pp. 2804-2807, XP031389651.
Robin Hoel, "Design Note DN504, Fec Implementation" Texas Instruments Design Notes Repository, Jan. 1, 2007; Retrieved from the internet URL: http//focus.ti.com/lit/an.swra113a/swra113a.pdf, XP002647992.
Article, "Convolutional Code", Retrieved from Internet URL: http://web.archive.org/web/20100429174641/http:wikipedia.org/wiki/Convolutional_code; Retreived Mar. 3, 2012; XP002671325.
International Search Report for corresponding application PCT/EP2012/050047 filed Jan. 3, 2012; Mail date Apr. 2, 2012.
Dr. Stephan Holsten et al. "Global Maritime Surveillance With Satellite-Based AIS", Oceans May 14, 2009.
Japanese Office Action issued Oct. 28, 2014 re: Application No. 2013-546736.
Yu Hasegawa et al. "A Decoding Algorithm for q-ary Turbo Codes by Deleting Trellis Branches", IEICE Technical Report Jul. 14, 2005, vol. 105, No. 190, pp. 9-14.
International Preliminary Report in Patentability for corresponding application PCT/EP2012/050047 filed Jan. 3, 2012; Mail date Jul. 18, 2013.

* cited by examiner

Fig. 9
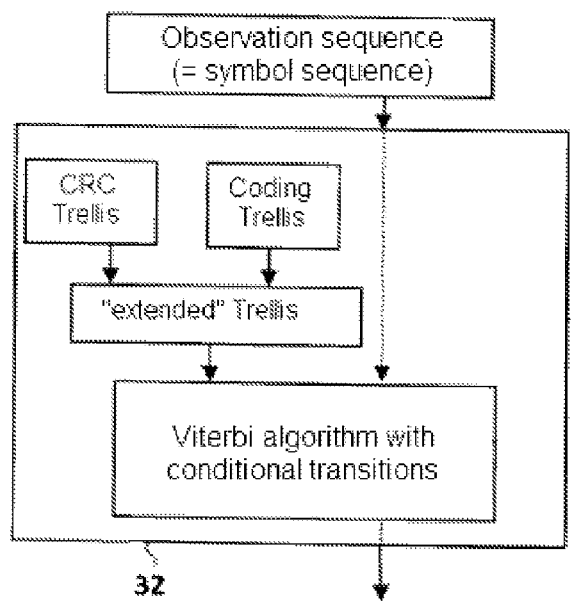
Fig. 11 (Comparative example)
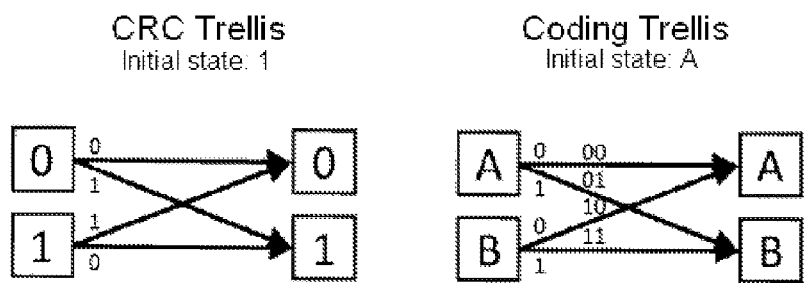

Fig. 10 (Comparative example)
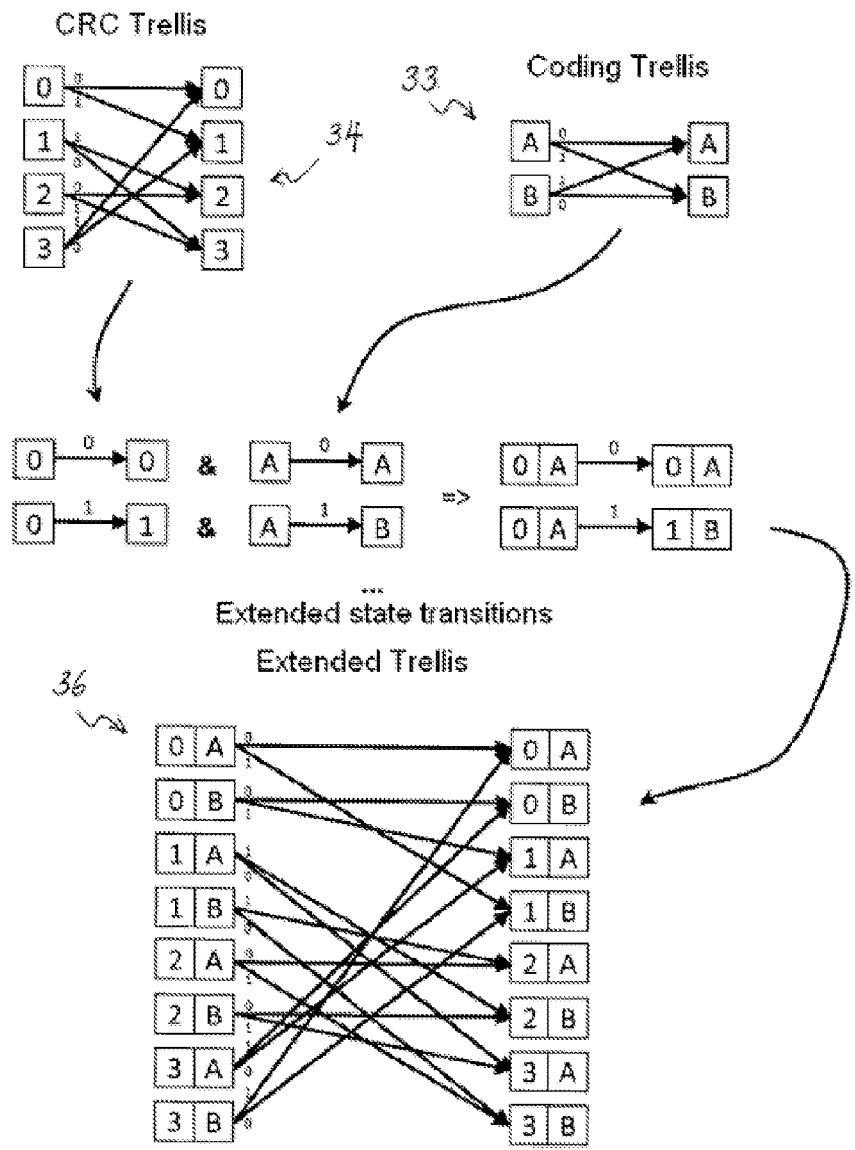

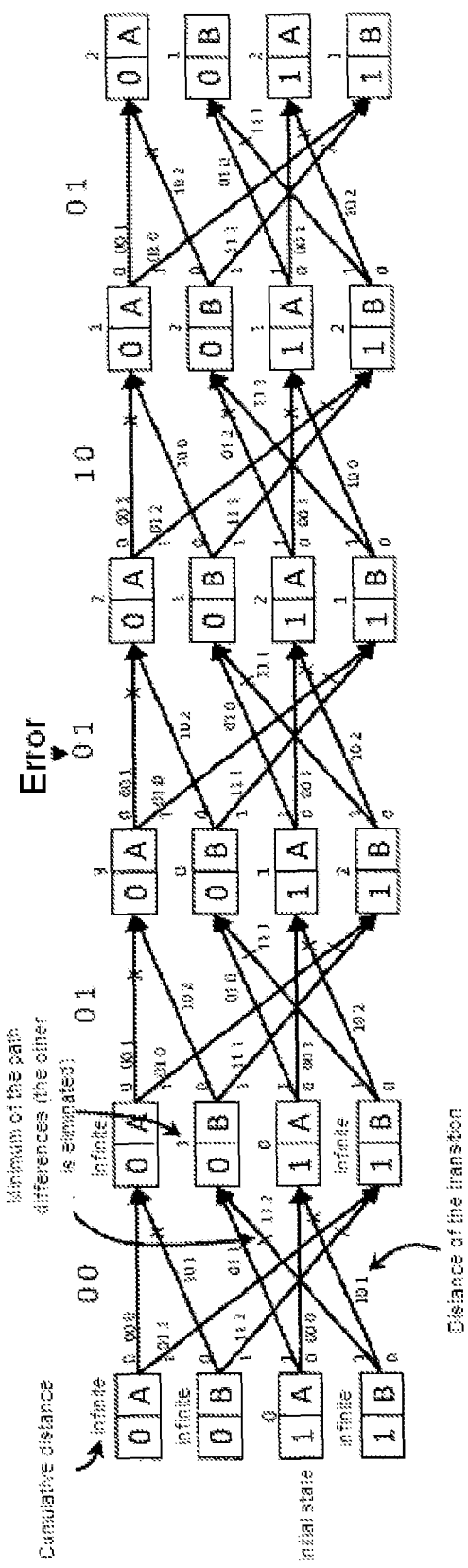
Fig. 12 (Comparative example)

Extended state transitions

METHOD FOR CORRECTING MESSAGES CONTAINING BIT STUFFING

TECHNICAL FIELD

The present invention relates to a method for correcting messages that contain stuffing bits (binary elements).

BACKGROUND

A conventional transmission chain is illustrated in FIG. 1. In a first step 12, the message to be transmitted 10 (original message) is used to calculate a cyclic redundancy check (CRC) block. The CRC technique is commonly used for detecting transmission errors by adding redundancy. The redundancy block is attached to the original message (by concatenating the binary sequences of the message and the redundancy block). Hereinafter, the message obtained by adding the redundancy block or by another preliminary transformation is designated "transformed message" in order to differentiate it from the original message. In the context of this document, the original message can be an informational message or any other message that can be represented in binary form.

The CRC block is a binary sequence of defined length, which is obtained by a hash of the original message. A CRC block of length n calculated on an original message of any given length permits the detection of all error bursts with a length that does not exceed n and a fraction of $1-2^{-n}$ of the error bursts having a greater length. The CRC block is calculated by polynomial modulo 2 division. For this purpose, a polynomial of the message, hereinafter denoted $M(x)$, is associated with the original message. The CRC block corresponds to the remainder $R(x)$ of the polynomial modulo 2 division of $M(x) \cdot x^{n+1}$ by the generator polynomial of degree n+1, denoted $G(x)$. The quotient of the division can be ignored. The degree of the remainder $R(x)$ cannot be greater than the degree of $G(x)$ minus one, i.e. n. Where necessary, O-valued bits are added to the remainder $R(x)$ to create a CRC block of fixed length. In order to calculate the CRC block, one can use in particular a linear feedback shift register. The data packet formed by the original message, onto which has been attached the CRC block, is sometimes referred to as "code word".

In the following step 14 the stuffing bits or stuffed bits that represent neither information nor redundancy are inserted in the transformed message. These stuffing bits are typically used to limit the number of consecutive bits of the same value and to introduce supplementary transitions. The supplementary transitions serve in particular to reduce the synchronization problems at the level of the receiver or to avoid the occurrence of binary sequences with a specific meaning (such as control sequences, for example). The HDLC protocol (acronym for High-level Data Link Control) uses stuffing bits to avoid the appearance of the flag for the time frame end (which in the case of HDLC corresponds to the binary sequence 01111110). According to the HDLC protocol, a 0 bit is inserted behind a sequence of five consecutive bits of value 1, thereby ensuring that the flag for the time frame end does not appear in the middle of a message. This is illustrated in FIG. 3. The stuffing bits can have the value 0 and/or 1, depending on the protocol specifications in question. In the case of HDLC or AIS (acronym for Automatic Identification System), the stuffing bits are always bits of value 0. It should also be noted that the concept of inserting stuffing bits must not be confused with the concept of padding that consists in the insertion of bits to arrive at a binary sequence of a predetermined length.

The transformed, stuffed message is then used to modulate (in the modulation step 16) a signal for the purposes of the transmission by the transmission channel 18. The modulation step 16 is possibly preceded by a channel coding (not shown in FIG. 1).

At the receiver side, the transmitted signal is demodulated (in the demodulation step 20) and decoded as needed. In order to recover the original message (the information bits), the stuffing bits are eliminated (step 22). In order to detect and/or correct the transmission errors, the receiver verifies the CRC of the message transmitted in step 24 before releasing the verified/corrected message (step 26) or an error message in the case where the correction would not be possible. Different methods are known for verifying the CRC. One of these methods consists in calculating the CRC on the received sequence of information bits and comparing it with the CRC of the transmitted message. A method that can be more easily implemented in hardware uses the property that the CRC of a binary sequence consisting of a message followed by its CRC is zero, and can be expressed as follows:

$$CRC([data,CRC(data)])=0$$

where CRC(.) designates the result of the calculation of CRC and [.,.] the concatenation of two binary sequences. Hence, with this method the CRC of the transmitted message is calculated (i.e. on the set of the information bits and the redundancy bits). If the result is 0 then the message is considered to have been correctly transmitted. Other methods exist that enable the position of an error bit to be detected. A method of this type is described, particularly in the article by B. McDaniel, An algorithm for error correcting cyclic redundance checks, C/C++ Users Journal, p. 6, 2003. Developments of this method enable several error bits to be corrected (cf. e.g. S. Babaie, A. K. Zadeh, S. H. Es-hagi, N. J. Nvimipour, Double bits error correction using CRC method, International Conference on Semantics, Knowledge and Grid, no 5, pp. 254-257, 2009 and C. Shi-yi and L. Yu-bai, Error correcting cycle redundancy checks based on confidence declaration, ITS Telecommunications Proceedings, no 6, pp. 511-514, 2006). However, all these methods assume that the stuffing bits were removed from the received message before they could be applied, which in practical terms greatly reduces their interest.

FIG. 2 shows a conventional transmission chain that differs from that of FIG. 1 in that the transformed message has been trellis coded in step 15 after stuffing bits had been inserted. At the receiver side, the transmitted signal is demodulated (in the demodulation step 20), e.g. by means of the Viterbi algorithm. The stuffing bits are eliminated after decoding but before verification of the CRC.

BRIEF SUMMARY

The disclosure proposes a message correction method that is applicable in the presence of stuffing bits.

The method according to the invention is applied to a message (message to be corrected), the generation of which involved a transformation of an original message and the insertion of stuffing bits into the transformed message.

The transformation can particularly comprise the calculation of a CRC block and the incorporation of this block into the original message.

The method comprises the provision (e.g. at the output of a demodulator) of an observation sequence containing the message to be corrected. A plurality of path hypotheses is then constructed across a trellis that is associated with the transformation in the sense that it comprises nodes and branches, where the nodes each represent a state of a finite-state machine capable of transforming the original message and where the branches represent the possible transitions between the nodes. A transition between a first node that represents a first state of the finite-state machine and a second node that represents a second state of the state machine is possible if, when applying a 0 value bit or a 1 value bit to the input of the finite-state machine in its first state, it passes into the second state. Among the branches of the trellis diagram, certain represent conditional transitions that may be made only when bit stuffing is present. During the generation of a path hypothesis, bit stuffing is detected and the branches taken are those associated with the detected bit stuffing. Among the different path hypotheses that were constructed, the one that is chosen is that which appears to be the most probable with respect to the observation sequence.

It should be noted that the generation of the message to be corrected does not normally constitute part of the method according to the invention (although it is not excluded). However, the method applies only to messages that have been generated in a certain manner. The form of the messages to be corrected, the transformation and the conditions that specify the insertion of stuffing bits are normally defined in a protocol. A message may be corrected only if it has been generated in accordance with this protocol.

The construction of the plurality of path hypotheses across the trellis and the selection are preferably based on the Viterbi algorithm or the SOVA algorithm (acronym for Soft Output Viterbi Algorithm). Possible transmission errors (up to a certain number of errors) are corrected by the selection of the most probable path hypothesis, i.e. the path hypothesis with the minimum distance (among all the constructed hypotheses) from the observation sequence.

In the case where the transformation of the original message comprises the calculation of a cyclic redundancy check block that is combined with the original message to produce the transformed message, then the nodes of the trellis each represent a calculator state (e.g. of a linear feedback shift register) likely to have calculated the cyclic redundancy check block.

Preferably, when the method is executed and a path hypothesis is being constructed, a stuffing bit is considered detected if the conditions according to which the insertion of a stuffing bit is performed are met. If, for example, a stuffing bit had been inserted immediately after each sequence of five consecutive bits having the value 1 before the transmission of the message, then in each path hypothesis a bit that immediately follows a sequence of five consecutive bits having the value 1 is considered to represent a stuffing bit.

A state variable is preferably associated with each path hypothesis and as the path hypothesis is being constructed, is updated as a function of the already constructed part of the path hypothesis. The state variable is then monitored so as to determine whether the conditions in which a stuffing bit is inserted are met. For example, this state variable can indicate the number of consecutive bits of the same value for each path hypothesis. In the example where a stuffing bit is inserted behind a bit on condition that this bit is preceded by a sequence of five bits having the value 1, then as a path hypothesis progresses across the trellis a variable is monitored that indicates the number of bits of value 1 which have immediately preceded the existing bit. As soon as this variable reaches the value 5, then the next bit has to be a stuffing bit and the corresponding conditional transition is chosen.

A preferred embodiment of the method of the invention is applied to messages whose generation comprises, as the transformation of the original message, the calculation of a cyclic redundancy check block that is added to the original message and a coding (e.g. a channel coding) of the transformed message after the stuffing bits have been inserted. In this preferred embodiment, the selection of the path across the trellis is part of the decoding. The nodes of the trellis then represent the elements of a Cartesian product of at least the set of states of an encoder likely to have performed said encoding and the set of states of a calculator likely to have calculated the cyclic redundancy check block. In this trellis, a transition from a first node, corresponding to a first encoder state and a first calculator state, to a second node, corresponding to a second encoder state and a second calculator state, is possible, in the presence of a bit of transformed message, if
on applying this bit of transformed message to the encoder that is in the first encoder state, the encoder then passes to the second encoder state, and
on applying this bit of transformed message to the calculator that is in the first calculator state, the calculator passes to the second calculator state, or, in the presence of a stuffing bit, if
on applying this stuffing bit to the encoder that is in the first encoder state, the encoder then passes to the second encoder state, and
the first calculator state is equal to the second calculator state.

It can be appreciated that the method according to the invention may be used for correcting AIS messages. The observation sequence is then obtained from an AIS signal, for example received by a satellite, in particular a low earth orbit satellite. The AIS signal is possibly received at the same time as other AIS signals (i.e. received simultaneously or with a time overlap). In this case the method according to the invention is advantageously combined with "decollision" and demodulation methods for the AIS signals, for example the SIC method (Successive Interference Cancellation) or the deterministic or adaptive beam formation. A method for generating a plurality of candidate AIS messages from colliding AIS signals is described in the document US 2008/0304597. These candidates could be used as observation sequences in the method according to the invention. Note that this method can be used at the level of a receiver on board a satellite or on the ground.

An aspect of the invention relates to a computer programmer containing instructions causing the implementation of the above-described method when the computer programmer is executed by a computer. The computer programmer can make up a part of a computer programmer product that comprises a data storage medium (e.g. a hard disc, a flash memory, a USB key, a CD, a DVD, RAM, etc.) on which the programmer is stored.

Another aspect of the invention relates to decoder configured e.g. with an appropriate computer programmer in order to implement the method of the invention.

BRIEF DESCRIPTION OF THE DRAWINGS

Other characteristics and features of the invention will become apparent from the detailed description of some advantageous exemplary embodiments given below, for illustration, with reference to the accompanying drawings. They show:

FIG. 9: a simplified schematic of a decoder to implement the decoding, the elimination of the stuffing bits and the correction of the transmitted message;

FIG. 10: an illustration of the construction of an extended trellis;

FIG. 11: a CRC trellis and a coding trellis;

FIG. 12: an illustration of the construction of path hypotheses across the extended trellis associated with the CRC and coding trellises of FIG. 11;

DETAILED DESCRIPTION

Variant without Trellis Coding

Figure 1:
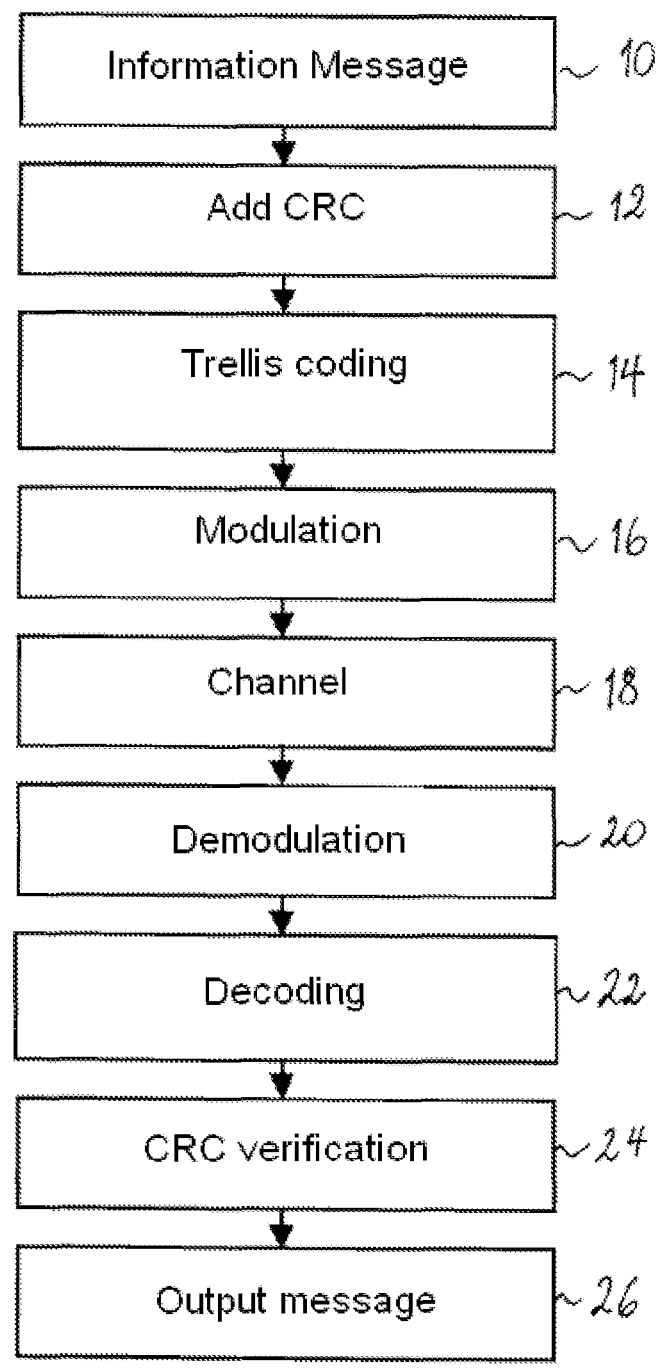
FIG. 1: an outline schematic of a conventional transmission chain of messages.
Figure 2:
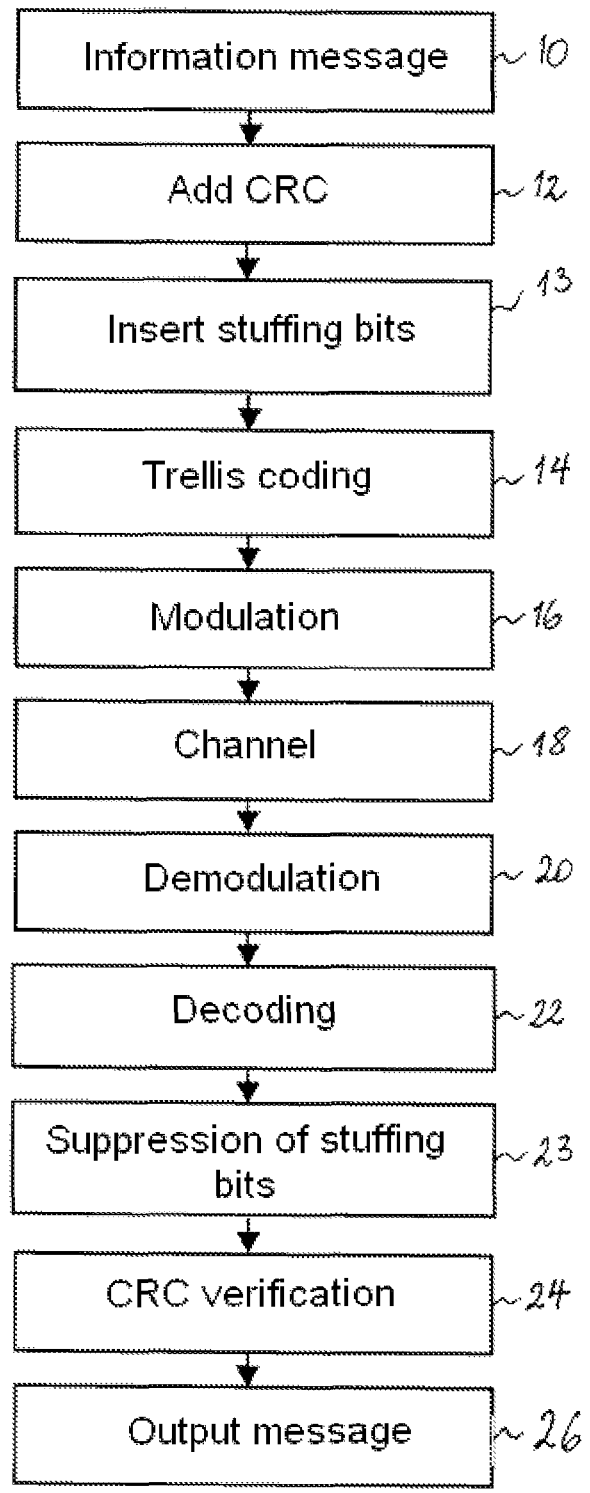
FIG. 2: an outline schematic of a conventional transmission chain of messages with trellis coding on the transmitter side and decoding on the receiver side.
Figure 3:
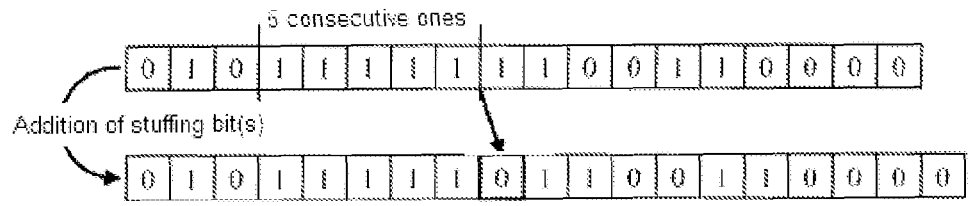
FIG. 3: an illustration of the insertion of stuffing bits.
Figure 4:
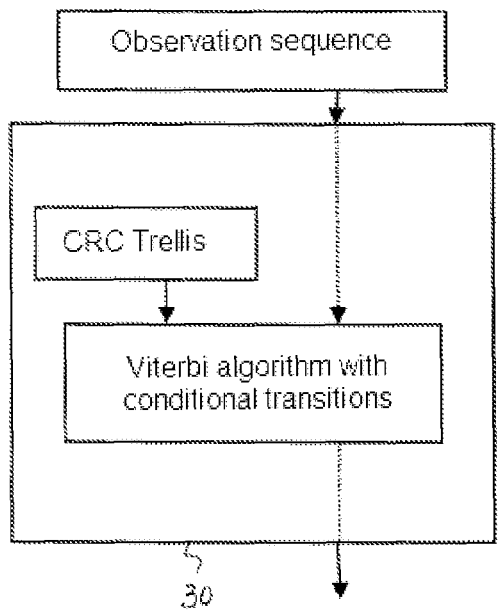
FIG. 4: a simplified schematic of a decoder to implement the method according to a first variant of the invention.

FIG. 4 shows a very simplified schematic of a decoder 30 to implement the method according to a first variant of the invention. This decoder 30 is intended to replace the elimination stage for the stuffing bits 22 and the CRC verification stage 24 in the conventional transmission chain shown in FIG. 1.

Hereinafter, we will assume that the stuffing bits are inserted as defined in the HDLC protocol, i.e. that one stuffing bit of value 0 is inserted immediately after each sequence of five consecutive bits of value 1. Note that this choice has been made solely to be able to illustrate the invention in the context of a practical example. The person skilled in the art will have no difficulty in adapting the method of the invention to other scenarios that involve the insertion of stuffing bits.

A CRC block can be calculated iteratively by means of a linear feedback shift register associated with the polynomial generator. The register is initialized (normally with the sequence [00 . . . 0] or [11 . . . 1], although any other initial register state could be specified by protocol). The original message is applied bit by bit to the register, followed by as many zeros as the register contains cells. The thus obtained final state corresponds to the CRC block that is attached to the original message. The CRC calculator intermediate states (the linear feedback shift register associated with the CRC polynomial generator) can be imagined to represent the states (nodes) of a trellis. These states are interconnected by transitions (branches) that link a first CRC calculator state to a second calculator state that is attained by inputting a new bit to the calculator when it is in the first state.

Figure 5:
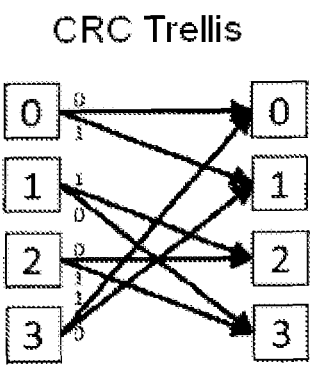
FIG. 5: a representation of a CRC trellis having four states.

FIG. 5 shows a CRC trellis that corresponds to the case where the CRC calculator can be in four different states, numbered 0, 1, 2 and 3. The arrows leaving each state correspond to the branches of the trellis and indicate the following state of the CRC calculator according to whether the applied input bit is zero or one.

On receiving an observation sequence, for example from a demodulator, the Viterbi algorithm can be used to correct the transmission errors: a plurality of path hypotheses across the CRC trellis is constructed, and the most probable path hypothesis with respect to the observation sequence is selected among them. However, this approach does not work if stuffing bits were inserted into the transformed message (the original message followed by its CRC block), given that the CRC block added to the original message does not take into account possible stuffing bits added later.

Figure 6:
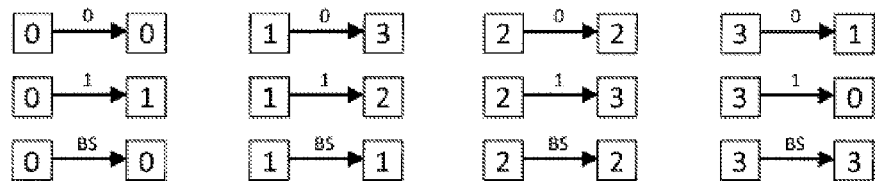
FIG. 6 a representation of a CRC trellis of FIG. 4 with additional branches that correspond to the conditional transitions.

In the context of the invention, it is therefore proposed to modify the CRC trellis in order to be able to correct a message with the help of the Viterbi algorithm or the SOVA algorithm even in the presence of stuffing bits that were inserted after the calculation and the insertion of the CRC block. For this purpose, conditional transitions between the CRC calculator states are added—transitions that can only be taken in the presence of a stuffing bit. FIG. 6 shows the trellis of FIG. 5 to which the conditional transitions have been added. In contrast to FIG. 5, the FIG. 6 shows the transitions between two states at each time in an individual manner. The conditional transitions are followed only in the case of a stuffing bit (called BS for stuffing bit). They link each state to itself, thereby reflecting that the stuffing bit does not cause any change in the CRC calculator state. Consequently, when a stuffing bit is detected in the course of constructing the path hypotheses across the trellis, only the conditional transition of a stuffing bit may be followed. As the CRC calculator state does not change in the case of a stuffing bit, this means that the bits identified as being stuffing bits are ignored in the course of constructing the path hypotheses.

Figure 7:
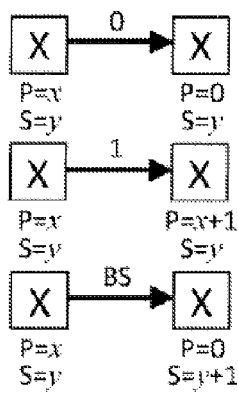
FIG. 7 an illustration of the updating of the state variables P and S utilized respectively to detect a stuffing bit and to indicate the total number of stuffing bits encountered.

In order to monitor for the appearance of stuffing bits in the course of constructing a path hypothesis, a state variable P(k, X)) associated with each state (X) is introduced (in the example, X=0, 1, 2 or 3) at "the instant" k. k indicates the number of states (of nodes) traveled in the trellis before arriving at the state considered via the surviving path hypothesis. P(k, X) indicates the number of consecutive bits of value 1 received immediately before reaching the state X at the instant k. Another state variable S(k, X) is introduced that indicates the total number of stuffing bits that were met in the trellis before reaching the state X at the instant k via the surviving path hypothesis. The number S of the ultimately retained path hypothesis permits the number of received information bits and CRC bits to be deduced. FIG. 7 shows the development of the variables P and S in the three possible situations. If the received bit is an information bit or a CRC bit with a value 0 then the variable P is reset to zero for the attained state; S remains the same. If the received bit is an information bit or a CRC bit with a value 1 then the variable P is increased by one unit for the attained state and S again remains the same. If the received bit is a stuffing bit then P is reset to zero for the attained state, whereas S is increased by one unit.

Figure 8:
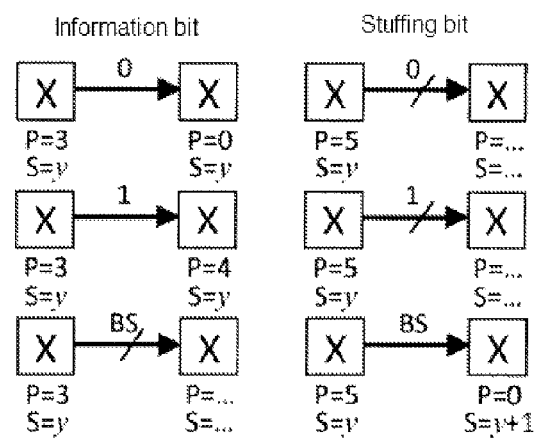
FIG. 8 an illustration of the decision step if a conditional transition for the stuffing bit has to be taken or not.

In the course of construction of a path hypothesis, the variable P indicates whether the next bit is an information bit (or CRC bit) or a stuffing bit. In our example, the necessary and sufficient condition for a bit to be detected as a stuffing bit is that the bit be immediately preceded with an uninterrupted sequence of five information bits or CRC bits having a value 1. If the variable P reaches 5 in a node of a path hypothesis (on the right in FIG. 8), then the next transition must be a transition associated with a stuffing bit. Transitions associated with an information bit or a CRC bit are then impossible. If, on the other hand, P<5 in a node of a path hypothesis (on the left in FIG. 8), then the next transition must be a transition associated with an information bit or a CRC bit. A transition associated with a stuffing bit is impossible starting from this state. In FIG. 8 the impossible transitions are crossed out. In practice, the impossibility of a transition can be expressed by conferring an "infinite" distance to it. A path hypothesis that is extended by a transition of infinite distance in the Viterbi algorithm will not be able to survive and will be eliminated.

In order to finally choose the most probable path hypothesis among the surviving path hypotheses with respect to the observation sequence, the following property can be used: CRC([data, CRC(data)])=0. It therefore follows that the path hypothesis to be selected must arrive at the CRC calculator state [00 . . . 0].

Variant with Trellis Coding

FIG. 9 shows a very simplified schematic of a decoder 32 to implement the method according to a second variant of the invention. This decoder 32 is intended to replace the decoding stages 21, the suppression of the stuffing bits 22 and the CRC verification 24.

This embodiment of the method uses an 'extended' trellis for decoding, the suppression of the stuffing bits and the CRC verification which corresponds to the trellis of a finite state machine that comprises the encoder and the CRC calculator, and in which the encoder and the CRC calculator are fed by the same input, i.e. change states according to the same binary sequence that is input.

In order to provide a better understanding of this method and the concept of the extended trellis, the method will first of all be explained with the help of FIGS. 10-12 for the case where the insertion of stuffing bits is not foreseen in the transmission protocol.

Comparative Example without Suppression of Stuffing Bits

The method uses an 'extended' trellis, whose nodes not only represent the different encoder states but also the calculator states of the CRC block. It is well known to use, e.g. in the context of the Viterbi algorithm, a trellis representing the states and transitions of the encoder. In contrast, the inventor is unaware that a trellis associated with the CRC calculator (briefly "CRC trellis") has ever been used in the context of decoding a sequence of symbols and for correcting associated transmission errors. Consequently, an explanation should be made on the meaning of "CRC trellis").

A CRC block can be calculated iteratively by means of a linear feedback shift register associated with the polynomial generator. The register is initialized (normally with the sequence [00 . . . 0] or [11 . . . 1], although any other initial register state could be specified by protocol). The original message is applied bit by bit to the register, followed by as many zeros as the register contains cells. The thus obtained final state corresponds to the CRC block that is attached to the original message. The CRC calculator intermediate states (the linear feedback shift register associated with the CRC polynomial generator) can be imagined to represent the states (nodes) of the CRC trellis. These states are interconnected by transitions (branches) that link a first CRC calculator state to a second calculator state that is attained by inputting a new bit to the calculator when it is in the first state.

FIG. 10 is an illustration of the construction of an extended trellis 36 from a coding trellis 33 and a CRC trellis 34. The CRC trellis 34 corresponds to a case where the CRC calculator can be in four different states, numbered 0, 1, 2 and 3. The arrows leaving each state correspond to the branches of the CRC trellis and indicate the following state of the CRC calculator according to whether the applied input bit is zero or one. The coding trellis 33 has two states.

The 'extended' trellis nodes corresponds to the Cartesian product $\{(0; A), (0; B), (1; A), \ldots, (3; B)\}$ of the set of the nodes of the CRC trellis $\{0, 1, 2, 3\}$ and of the set of the nodes of the coding trellis $\{A, B\}$. A transition between a first node ($\alpha$; X), corresponding to a first calculator state $\alpha \in \{0, 1, 2, 3\}$ and a first encoding state $X \in \{A, B\}$, to a second node ($\beta$; Y), corresponding to a second calculator state $\beta \in \{0, 1, 2, 3\}$ and a second encoding state $Y \in \{A, B\}$ is possible if the transitions $\alpha \to \beta$ and $X \to Y$ of the CRC trellis, respectively the coding trellis, are generated by the same input bit (0 or 1). For example, if the state Y (respectively Z) of the coding trellis leads to the state X when the transmitted bit is 0 (respectively 1) and the state $\beta$ (respectively $\gamma$) of the CRC trellis leads to the state $\alpha$ when the transmitted bit is 0 (respectively 1), then the state ($\beta$; YY (respectively ($\gamma$; Z)) leads to the state ($\alpha$; XX when the transmitted bit is 0 (respectively 1). In FIG. 10, the bit that generates a transition is placed each time next to the arrow that represents it.

The number of extended trellis states amounts to the product of the number of nodes of the coding trellis and of the CRC trellis. The CRC trellis in particular can exhibit a very high number of nodes. There exist e.g. CRC blocks with 64 bits, corresponding to a CRC trellis with $2^{64}$ possible states.

To explain the progress of an embodiment of the inventive method based on the Viterbi algorithm, the shortest possible CRC (1 bit) was chosen so as to be able to graphically illustrate the construction of the path hypotheses across the trellis (see FIG. 12). The CRC and coding trellises selected in the example are shown in FIG. 11.

Let us assume that the original message is represented by the binary sequence [0 1 1 0]. The CRC block calculated for this original message is [1]. This CRC block corresponds to the parity bit that indicates if the number of ones in the original message is even. The data packet (transformed message) obtained by concatenation of the original message and the CRC block is [0 1 1 0 1].

By applying the coding trellis of FIG. 11, the coding of [0 1 1 0 1] gives the symbol sequence [00 01 11 10 01]. An error of one bit is added at the level of the third symbol to illustrate that the correction is made. The symbol sequence at the input of the decoder is presumed to be [00 01 01 10 01].

FIG. 12 shows the construction of the path hypotheses across the extended trellis according to the Viterbi algorithm. The initial states of the CRC calculator and the encoder are known when decoding. Therefore, right at the beginning, the path hypotheses that do not begin at the state (1; A) can be excluded. Alternatively, an infinite distance is attributed to the path hypotheses that start with a state that differs from the initial state (solution used in the depiction in FIG. 12). This way ensures that these path hypotheses will be eliminated in the course of the progression across the trellis. FIG. 12 shows beside each transition the symbol to which this transition corresponds. The indication of the symbol is followed by the distance (Hamming) between the observed symbol and the symbol to which the transition corresponds. Each time that the path hypotheses arrive at the same node of the trellis, only that which exhibits the lowest cumulative distance survives. The other path hypotheses are eliminated. In FIG. 12 the eliminated path hypotheses are marked with a cross and the cumulative distance of the surviving path hypothesis is noted above the node in question. In the following, the cumulative distance is designated $\Gamma(k, (\alpha; X))$ at the state $(\alpha; X)$ at the instant k.

When the final state is reached, the path hypothesis with the minimum distance is selected. It should be noted that in the case of the example, the path hypotheses that arrive at the nodes (0; B) and (1; B) possess the same minimum distance 1. Here, the property CRC([data, CRC(data)])=0 is used, since it follows from this that the final state of the CRC calculator must be 0. Consequently, the path hypothesis leading to the state (0; B) is retained. The message that is found is therefore [0 1 1 0 1]. The transmission error has been corrected.

Variant with Suppression of Stuffing Bits

The procedure for the example discussed above may not be applied as such in the case where stuffing bits had been inserted after the calculation of the CRC block.

In order to take account of the (possible) presence of stuffing bits, special transitions are entered into the extended trellis. These transitions are followed when a stuffing bit is received and are defined in such a way that the stuffing bits are taken into account in the same way as the information bits or the CRC bits for the succession of the encoder states, whereas the CRC calculator state remains unchanged when the received bit is a stuffing bit.

Hereinafter, we will assume that the stuffing bits are inserted as defined in the HDLC protocol, i.e. that one stuffing bit of value 0 is inserted immediately after each sequence of five consecutive bits of value 1. Note that this choice has been made solely to be able to illustrate the invention in the context of a practical example. The person skilled in the art will have no difficulty in adapting the method of the invention to other scenarios that involve the insertion of stuffing bits.

Figure 13:
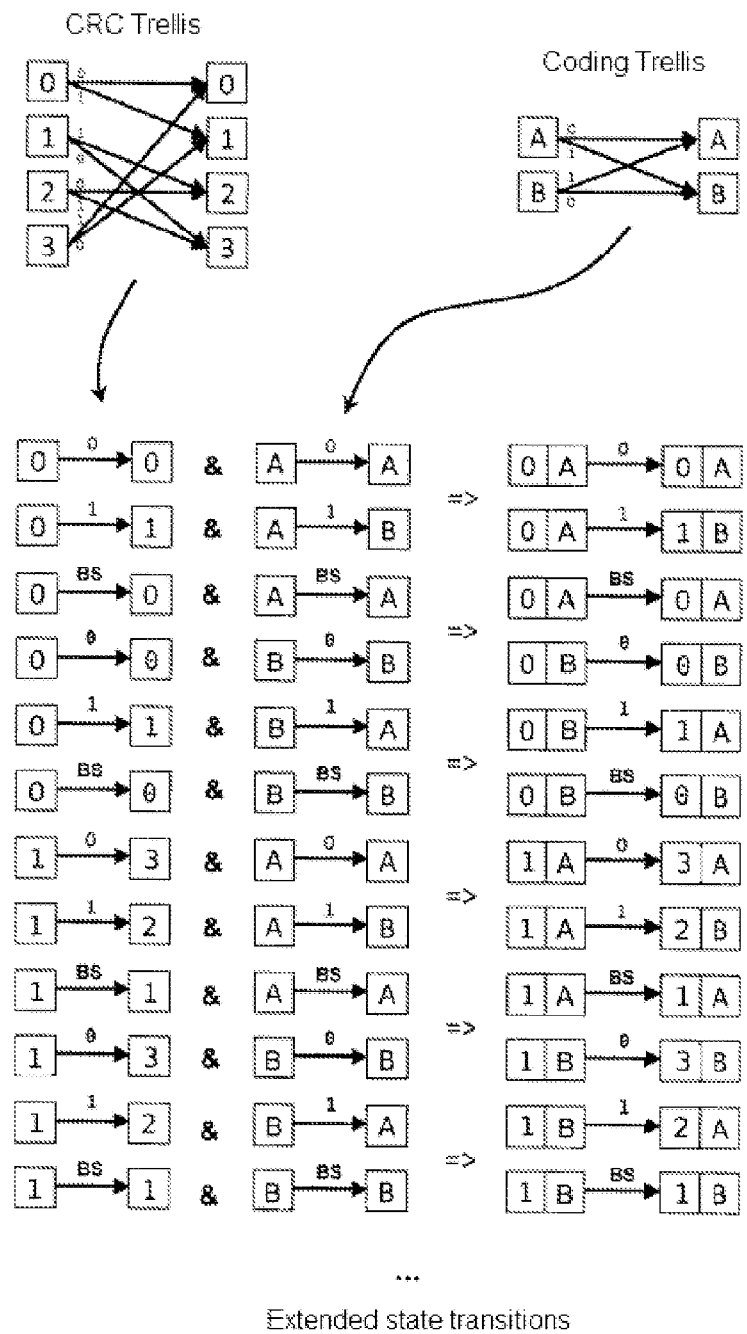
FIG. 13: an illustration of the construction of an extended trellis with transitions associated with the reception of a stuffing bit (conditional transitions)

The construction of a trellis extended to conditional transitions of stuffing bits starting from a CRC trellis and a coding trellis is illustrated in FIG. 13. The CRC and coding trellises are the same as in FIG. 10. The set of the extended trellis nodes again corresponds to the Cartesian product {(0; A), (0; B), (1; A), ..., (3; B)} of the set of the nodes of the CRC trellis {0, 1, 2, 3} and of the set of the nodes of the coding trellis {A, B}. The transitions associated with the information bits or the CRC bits (of the data packet) can now be distinguished from the conditional transitions associated with the stuffing bits. The transitions associated with the information bits or the CRC bits are the same as in FIG. 10. A transition associated with an information bit or CRC bit of a first node $(\alpha; X)$, corresponding to a first calculator state $\alpha \in \{0, 1, 2, 3\}$ and a first encoding state $X \in \{A, B\}$, to a second node $(\beta; Y)$, corresponding to a second calculator state $\beta \in \{0, 1, 2, 3\}$ and a second encoding state $Y \in \{A, B\}$ is possible if the transitions $\alpha \rightarrow \beta$ and $X \rightarrow Y$ of the CRC trellis, respectively the coding trellis, are generated by the same information bit or CRC bit (0 or 1) applied at the input.

A transition associated with a stuffing bit BS of a first node $(\alpha; X)$, corresponding to a first calculator state $\alpha \in \{0, 1, 2, 3\}$ and a first encoding state $X \in \{A, B\}$, to a second node $(\beta; Y)$, corresponding to a second calculator state $\beta \in \{0, 1, 2, 3\}$ and a second encoding state $Y \in \{A, B\}$ is possible if $\alpha = \beta$ and if the transition $X \rightarrow Y$ of the coding trellis is possible for an information bit or CRC bit having the same value as the stuffing bit BS. If the stuffing bits are inserted as specified in the HDLC protocol, then all the stuffing bits will have the value 0.

If the state Y (respectively Z) of the coding trellis leads to the state X when the transmitted bit is an information bit or CRC bit of value 0 (respectively 1) and the state $\beta$ (respectively $\gamma$) of the CRC trellis leads to the state a when the transmitted bit is an information bit or CRC bit of value 0 (respectively 1), then the state $(\beta; Y)$ (respectively $(\gamma; Z)$) leads to the state $(\alpha; X)$ when the transmitted bit is an information bit or CRC bit of value 0 (respectively 1).

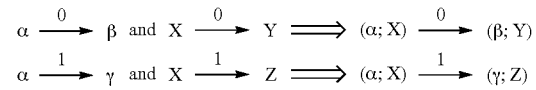

In the presence of a stuffing bit BS (of value 0) then the transitions in this case are:

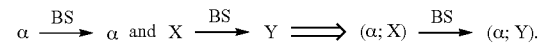

The conditional transitions are made in the trellis only if a stuffing bit is received. In order to monitor for the appearance of stuffing bits in the course of constructing a path hypothesis, a state variable $P(k, (\alpha; X))$ associated with each state $(\alpha; X)$ is introduced (in the example, $\alpha=0, 1, 2$ or 3 and X=A or B) at "the instant" k. k indicates the number of states (of nodes) traveled in the trellis before arriving at the state considered via the surviving path hypothesis. $P(k, (\alpha; X))$ indicates the number of consecutive bits of value 1 received immediately before reaching the state $(\alpha; X)$ at the instant k. Another state variable $S(k, (\alpha; X))$ is introduced that indicates the total number of stuffing bits that were met in the trellis before reaching the state $(\alpha; X)$ at the instant k via the surviving path hypothesis. The number S of the ultimately retained path hypothesis permits the number of received information bits and CRC bits to be deduced.

| k | Received bit | k + 1 |
|---|---|---|
| $(\alpha; X)$ $P_k < 5, S_k$ | 0 | $(\beta; Y)$ $P_{k+1} = 0, S_{k+1} = S_k$ |
| $(\alpha; X)$ $P_k < 5, S_k$ | 1 | $(\gamma; Z)$ $P_{k+1} = P_k + 1, S_{k+1} = S_k$ |
| $(\alpha; X)$ $P_k < 5, S_k$ | BS impossible! | $(\alpha; Y)$ |
| $(\alpha; X)$ $P_k = 5, S_k$ | 0 impossible! | $(\beta; Y)$ |
| $(\alpha; X)$ $P_k = 5, S_k$ | 1 impossible! | $(\gamma; Z)$ |

-continued

| k | Received bit | k + 1 |
|---|---|---|
| (α; X)<br>$P_k = 5, S_k$ | BS → | (α; Y)<br>$P_{k+1} = 0, S_{k+1} = S_k + 1$ |

The above table shows the development of the variables P et S in all possible situations. If the received bit is an information bit or a CRC bit with a value 0 then the variable P is reset to zero for the attained state; S remains the same. If the received bit is an information bit or a CRC bit with a value 1 then the variable P is increased by one unit for the attained state and S again remains the same. If the received bit is a stuffing bit (P=5) then P is reset to zero for the attained state, whereas S is increased by one unit.

In the course of construction of a path hypothesis across the extended trellis, the variable P indicates whether the next bit is an information bit (or CRC bit) or a stuffing bit. In our example, the necessary and sufficient condition for a bit to be detected as a stuffing bit is that the bit be immediately preceded with an uninterrupted sequence of five information bits or CRC bits having a value 1. If the variable P reaches 5 in a node of a path hypothesis, then the next transition must be a transition associated with a stuffing bit. Transitions associated with an information bit or a CRC bit are then impossible. If, on the other hand, P<5 in a node of a path hypothesis, then the next transition must be a transition associated with an information bit or a CRC bit. A transition associated with a stuffing bit is impossible starting from this state. In practice, the impossibility of a transition can be expressed by conferring an "infinite" distance to it. A path hypothesis that is extended by a transition of infinite distance in the Viterbi algorithm will not be able to survive and will be eliminated.

To choose the most probable path hypothesis, the characteristic that the final CRC calculator state is equal to 0 can again be used. However, the final encoder state $\theta_{TC}^f$ and the number of bits (information, CRC and stuffing bits) K of the transmitted message are a priori unknown. $\hat{K}$ and $\hat{\theta}_{TC}^f$ represent the values of K, respectively $\theta_{TC}^f$, among the possible values of K and $\theta_{TC}^f$, which together minimize the distance $\Gamma(K, (0; \theta_{TC}^f))$:

$$(\hat{K}, \hat{\theta}_{TC}^f) = \underset{K, \theta_{TC}^f}{\operatorname{argmin}} \Gamma(K, (0; \theta_{TC}^f))$$

with the constraint: $S_{min} \leq S(K, (0; \theta_{TC}^f)) \leq S_{max}$ and $N_{min} \leq K - S(K, (0; \theta_{TC}^f)) \leq N_{max}$;
where $S_{min}$ and $S_{max}$ designate respectively the minimum number and the maximum number of stuffing bits, and $N_{min}$ et $N_{max}$ designate respectively the minimum number and the maximum number of information bits and CRC bits. These numbers are defined in the context of the application. For example, for AIS, $S_{min}=0$ and $S_{max}=4$ and $N_{min}=N_{max}=184$. $\hat{K}$ can assume any value between the minimum number of bits $K_{min}=N_{min}+S_{min}$ and the maximum number of bits $K_{max}=N_{max}+S_{max}$.

Example of a Computer Programmer

A source code for a computer programmer used to implement the method according to the preceding example is briefly presented below. The computer programmer excerpts that are referred to are to be found in the appendix at the end of the description.

The first excerpt of the programmer relates to the initialization of the variables. In the context of the programmer, the initial state of the extended trellis is designated by (A; α). A (=the initial state of the CRC calculator) is initialized according to the communication protocol. In the case of AIS, which uses CRC-16, A is initialized to $2^{16}-1$. The distance $\Gamma(0, (A; \alpha))$ is set to zero for all possible values of α (=initial encoder state) if α is unknown. If α is known then: $\Gamma(0, (A; \alpha))=0$. The state variable R(k, $(\theta_{CRC}; \theta_{TC})$) corresponds to the bit (0, 1, or BS) associated with the last transition at the instant k of the surviving path hypothesis at the node $(\theta_{CRC}; \theta_{TC})$.

In the second excerpt of the programmer, the transition variables are updated for each received symbol.

$x_k$ designates the symbol received at the instant k, $N_s$ the number of possible symbols, $S_s$ the s-th symbol (of the possible symbols $N_S$, Distance($x_k$, $S_s$) is the distance between the symbol received at the instant k and the symbol $S_s$. $\theta_{CRC}$ et $\theta_{TC}$ are the states of the CRC block calculator and the encoder respectively. $N_{CRC}$ represents the number of possible states of the CRC trellis and $N_{TC}$ the number of possible states of the coding trellis. NextS($\theta_{TC}$, t) refers to the number (s) of the symbol when the encoder is found in the state $\theta_{TC}$ and a bit t is received (t can assume the values 0, 1, or BS). The transition variable $\Gamma_{trans}((\theta_{CRC};\theta_{TC}),t)$ is defined at the instant k as the sum of $\Gamma(k-1,(\theta_{CRC};\theta_{TC}))$ and the distance between the symbol received at the instant k and the symbol corresponding to the transition that starts from the state $(\theta_{CRC}; \theta_{TC})$ and that is associated with the bit t. The transition variable $S_{trans}(\theta_{CRC}; \theta_{TC})$ is defined at the instant k as S(k-1, $(\theta_{CRC}; \theta_{TC})$) incremented by one if a stuffing bit is received after the state $(\theta_{CRC}; \theta_{TC})$ at the instant k. The transition variable $P_{trans}((\theta_{CRC}; \theta_{TC}), t)$ is defined at the instant k as P(k-1, $(\theta_{CRC}; \theta_{TC})$) incremented by one when the state $(\theta_{CRC}; \theta_{TC})$ is followed by a bit of one (t=1) at the instant k. In the case where the received bit is not a stuffing bit (t≠BS), the transition variables are updated as in the conventional Viterbi algorithm. In the opposite case, only the conditional transitions remain possible (an infinite distance is attributed to the transitions associated with an information bit or CRC bit).

The third part of the programmer deals with the calculation of the state variables. The function Prevθ$_{CRC}$($\theta_{CRC}$, t) refers to the CRC calculator state that precedes the state $\theta_{CRC}$ if the bit t is received. The function Prevθ$_{TC}$($\theta_{TC}$, t) refers to the encoder state, to which follows the state $\theta_{TC}$ if the bit t is received.

In the fourth excerpt, the optimum path hypothesis is retraced across the extended trellis. Starting from the estimated final state (0; $\hat{\theta}_{TC}^f$), the preceding states are determined iteratively by following each time in the reverse direction the transition branch that survived the currently located state. Each time a transition is followed that corresponds to an information bit or a CRC bit (t=0 or 1), the corresponding bit is saved in the variable $U_n$. The sequence $(U_n)$ represents the decoded message from which the stuffing bits have been eliminated.

Results of Simulations

Figure 14:
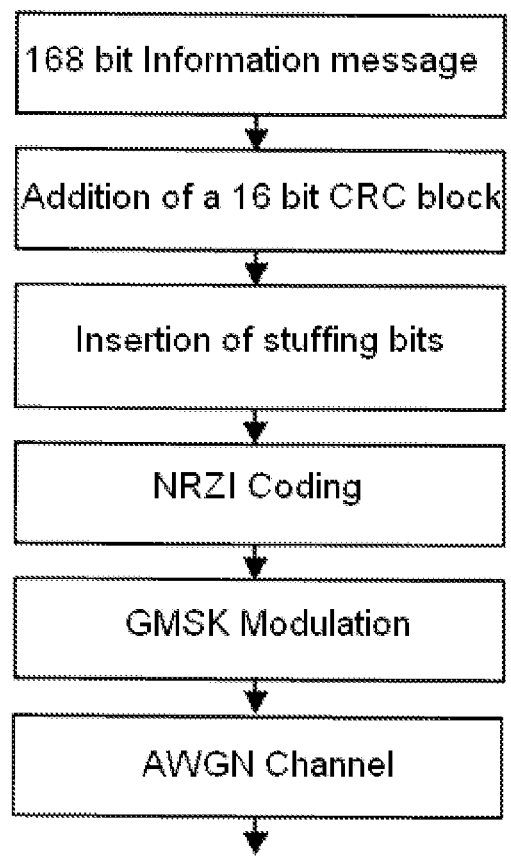
FIG. 14: an outline schematic of the transmitting side of an AIS transmission chain.

In order to illustrate the performance of a decoder that implements the method according to the invention, simulations were carried out for the case of an AIS transmission chain, such as the one illustrated in FIG. 14. The original message had a fixed length of 168 bits. After having added a CRC 16 block, stuffing bits were inserted (in accordance with the AIS protocol after a sequence of five consecutive 1 bits). The thus obtained frame was NRZI (Non Return to Zero Inverted) encoded, and GMSK (Gaussian Minimum Shift Keying) modulated with the parameters BT (product of the frequency band at −3 dB from the generating function of the Gaussian filter by the period symbol)=0.3 and LT (half-length of the Gaussian filter)=4. We assume the hypothesis of an AWGN (Additive White Gaussian Noise) transmission channel. In this example the NRZI coding and the GMSK modulation represent the trellis coding. According to the ITU recommendation ITU-R M.1371 on the technical characteristics of the AIS system, the polynomial generator for calculating the CRC block is $G(x)=x^{16}+x^{12}+x^5+1$.

The decoder according to the invention is compared with a receiver based on an optimal GMSK modulator that uses the coherent demodulation based on the Viterbi algorithm. In the NRZI decoding under consideration, a change is associated with the 0 bit and the 1 bit is detected if there is no change.

Figure 15:
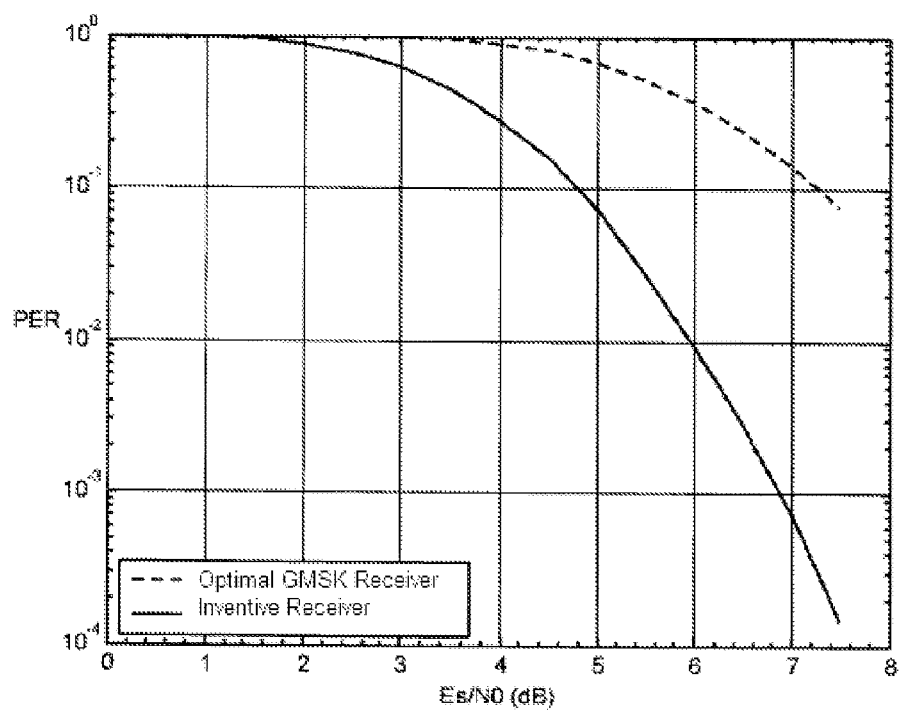
FIG. 15: a graphical representation of the simulated packet error rate (PER) as a function of the signal to noise ratio for an optimal GMSK receiver and for a receiver using the method according to the invention.

FIG. 15 shows the packet error rate (PER, defined as the ratio of the corrupted packets, i.e. containing at least one error bit, to the total number of transmitted packets) of a receiver using a decoder according to the invention and an optimal GMSK receiver as a function of the signal to noise ratio (Es/N0). It should be noted that the proposed receiver exhibits a gain of more than 2.5 dB with respect to the optimal GMSK receiver.

Figure 16:
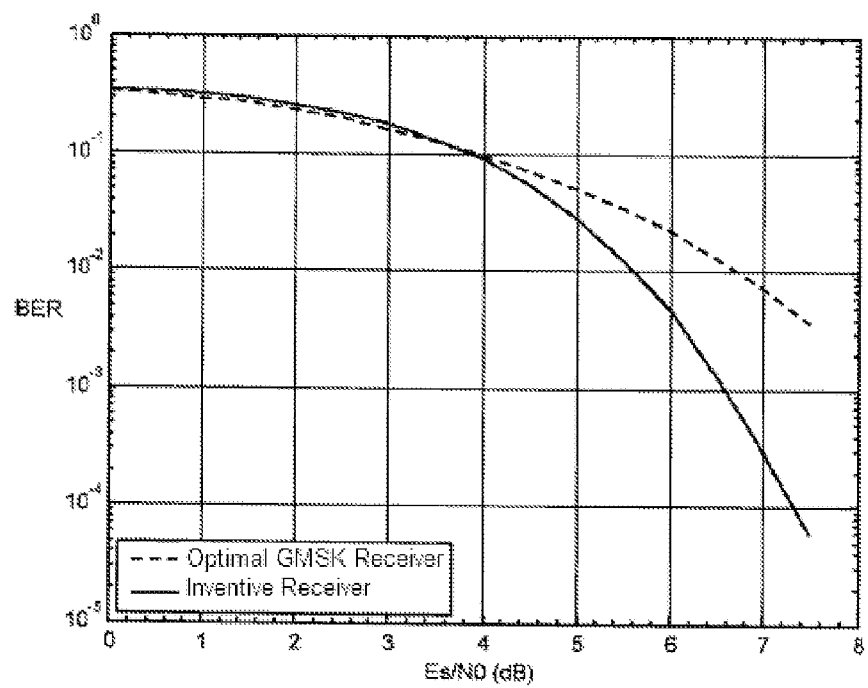
FIG. 16: a graphical representation of the simulated bit error rate (BER) as a function of the signal to noise ratio for an optimal GMSK receiver and for a receiver using the method according to the invention.

FIG. 16 shows the bit error rate (BER, defined as the ratio of the error bits to the total number of bits transmitted during a certain period of time) of a receiver using a decoder according to the invention and an optimal GMSK receiver as a function of the signal to noise ratio (Es/N0). The high error rate of FIG. 16 indicates that the error rate in the corrupted messages is high. In other words, when a message contains at least one error, on average it contains many. This enables verification methods for data consistency to be used to determine if a message contains errors. The use of such methods has proven to be useful for the detection of corrupted messages because the CRC block cannot be used to reject a decoded message as a corrupted one. However, a CRC block could be included from the outset in the original message; this block would not be used for error correction but for verifying that the message is error-free after the method according to the invention had been run. However, this CRC may not use the same polynomial generator as that of the CRC used to correct the errors. Otherwise, the second CRC will always be equal to 0 as a result of the application of CRC([data, CRC(data)])=0.

Excerpts from the Computer Program

```
Part 1 (initialization)
    Γ(0, (:; :)) ← ∞
    Γ(0, (A; α)) ← 0
    P(0, (:; :)) ← 0
    S(0, (:; :)) ← 0
    R(0, (:; :)) ← 0
Part 2 (calculation of the transition variables)
    for s = 1 to N_S do
        d(s) ← Distance(x_k, S_s)
    end for
    for θ_TC = 0 to N_TC − 1 do
        Γ_trans((:; θ_TC), 0) ← d(NextS(θ_TC, 0))
        Γ_trans((:; θ_TC), 1) ← d(NextS(θ_TC, 1))
    end for
    Γ_trans((:; :), 0) ← Γ_trans((:; :), 0) + Γ(k − 1, (:; :))
    Γ_trans((:; :), 1) ← Γ_trans((:; :), 1) + Γ(k − 1, (:; :))
    Γ_trans((:; :), BS) ← ∞
    P_trans((:; :), 0) ← 0
    P_trans((:; :), 1) ← P(k − 1, (:; :)) + 1
    P_trans((:; :), BS) ← 0
    S_trans((:; :)) ← S(k − 1, (:; :))
    for θ_CRC = 0 to N_CRC − 1 do
        for θ_TC = 0 to N_TC − 1 do
            if P(k − 1, (θ_CRC; θ_TC)) = 5 then
                Γ_trans((θ_CRC; θ_TC), BS) ← Γ_trans((θ_CRC; θ_TC), 0)
                Γ_trans((θ_CRC; θ_TC), 0) ← ∞
                Γ_trans((θ_CRC; θ_TC), 1) ← ∞
                S_trans((θ_CRC; θ_TC)) ← S_trans((θ_CRC; θ_TC)) + 1
            end if
        end for
    end for
Part 3 (calculation of the state variables)
    for θ_CRC = 0 to N_CRC − 1 do
        for θ_TC = 0 to N_TC − 1 do
            σ_CRC(0) ← Prevθ_CRC(θ_CRC, 0)
            σ_CRC(1) ← Prevθ_CRC(θ_CRC, 1)
            σ_CRC(2) ← θ_CRC
            σ_TC(0) ← Prevθ_TC(θ_TC, 0)
            σ_TC(1) ← Prevθ_TC(θ_TC, 1)
            σ_TC(2) ← Prevθ_TC(θ_TC, 0)
            t ← arg min_t Γ_trans((σ_CRC(t); σ_TC(t)), t)
            Γ(k, (θ_CRC; θ_TC)) ← Γ_trans((σ_CRC(t); σ_TC(t)), t)
            P(k, (θ_CRC; θ_TC)) ← P_trans((σ_CRC(t); σ_TC(t)), t)
            S(k, (θ_CRC; θ_TC)) ← S_trans((σ_CRC(t); σ_TC(t)))
            R(k, (θ_CRC; θ_TC)) ← t
        end for
    end for
Part 4 (reading the path)
    θ_CRC ← 0
    θ_TC ← θ_TC^f
    n ← K − S(K, (0; θ_TC^f))
    for k = K to 1 do
        t ← R(k, (θ_CRC; θ_TC))
        if t ≠ BS then
            θ_CRC ← Prevθ_CRC(θ_CRC, t)
            θ_TC ← Prevθ_TC(θ_TC, t)
            U_n ← t
            n ← n − 1
        else
            θ_TC ← Prevθ_TC(θ_TC, 0)
        end if
    end for
```

The invention claimed is:

1. A method for correcting a message to be corrected that has been generated by transforming an initial message and by inserting stuffing bits into the transformed message; the method comprising
   providing an observation sequence that contains the message to be corrected,
   constructing a plurality of path hypotheses across a trellis comprising nodes and branches, said branches representing the possible transitions between said nodes,
   selecting the most probable path hypothesis from said path hypotheses, with respect to the observation sequence of symbols,
   wherein in said trellis, said nodes each represent a state of a finite state machine likely to execute said transformation of the initial message,
   wherein said branches comprise branches representing conditional transitions that can be made solely in the presence of a stuffing bit, and
   wherein, as a path hypothesis is being constructed, stuffing bits are detected and the branches associated with the stuffing bits are made.

2. The method according to claim 1, wherein the construction of the plurality of path hypotheses across the trellis and the selection are based on the Viterbi algorithm or on the SOVA algorithm.

3. The method according to claim 1, wherein said transformation of the initial message comprises the calculation of a cyclic redundancy check block that is combined with the initial message to produce the transformed message, and wherein said nodes each represent a state of a calculator likely to have calculated the cyclic redundancy check block.

4. The method according to claim 1, wherein as a path hypothesis is being constructed, a stuffing bit is considered detected if the conditions according to which the insertion of a stuffing bit is performed are met.

5. The method according to claim 4, wherein a state variable is associated with each path hypothesis, said state variable being updated as the path hypothesis is being constructed depending on the already constructed path of the path hypothesis, and wherein the state variable is monitored to determine if the conditions in which the insertion of a stuffing bit is performed are met.

6. The method according to claim 5, wherein for each path hypothesis said state variable indicates the number of consecutive bits of the same value.

7. The method according to claim 1,
wherein said transformation of the initial message comprises the calculation of a cyclic redundancy check block that is combined with the initial message to produce the transformed message,
wherein the message to be corrected is obtained by decoding a sequence of symbols generated by encoding the transformed message after insertion of stuffing bits, the selection of said path across the trellis being part of said decoding,
wherein the nodes of said trellis represent the elements of a Cartesian product of at least the set of states of an encoder likely to have performed said encoding and the set of states of a calculator likely to have calculated the cyclic redundancy check block,
a transition from a first node, corresponding to a first encoder state and a first calculator state, to a second node, corresponding to a second encoder state and a second calculator state, is possible,
in the presence of a bit of transformed message, if
on applying this bit of transformed message to the encoder that is in the first encoder state, the encoder then passes to the second encoder state, and
on applying this bit of transformed message to the calculator that is in the first calculator state, the calculator passes to the second calculator state,
or, in the presence of a stuffing bit, if
on applying this stuffing bit to the encoder that is in the first encoder state, the encoder then passes to the second encoder state, and
the first calculator state is equal to the second calculator state.

8. The method according to claim 1, wherein the observation sequence is obtained from an MS signal.

9. The method according to claim 8, wherein said observation sequence is obtained from a plurality of simultaneous or time-overlapping MS signals.

10. A computer program product comprising a non-transitory, non-volatile memory having stored therein a computer program containing instructions causing the implementation of the method according to claim 1 when the computer programme is executed by a computer.

11. A decoder configured for implementing a method for correcting a message to be corrected that has been generated by transforming an initial message and by inserting stuffing bits into the transformed message; the method comprising
providing an observation sequence that contains the message to be corrected,
constructing a plurality of path hypotheses across a trellis comprising nodes and branches, said branches representing the possible transitions between said nodes,
selecting the most probable path hypothesis from said path hypotheses, with respect to the observation sequence of symbols,
wherein, in said trellis, said nodes each represent a state of a finite state machine likely to execute said transformation of the initial message,
wherein said branches comprise branches representing conditional transitions that can be made solely in the presence of a stuffing bit,
and wherein, as a path hypothesis is being constructed, stuffing bits are detected and the branches associated with the stuffing bits are made.

12. The method according to claim 8, wherein said MS signal is received by a satellite.

13. The method according to claim 12, wherein said satellite is a low earth orbit satellite.

* * * * *